United States Patent

Pinnow et al.

(10) Patent No.: US 7,613,028 B2
(45) Date of Patent: Nov. 3, 2009

(54) SOLID ELECTROLYTE SWITCHING ELEMENT

(75) Inventors: Cay-Uwe Pinnow, Munich (DE); Klaus-Dieter Ufert, Unterschleissheim (DE)

(73) Assignee: Infineon Technologies AG, Munich (DE)

( * ) Notice: Subject to any disclaimer, the term of this patent is extended or adjusted under 35 U.S.C. 154(b) by 506 days.

(21) Appl. No.: 11/131,498

(22) Filed: May 18, 2005

(65) Prior Publication Data

US 2005/0286211 A1 Dec. 29, 2005

(30) Foreign Application Priority Data

May 18, 2004 (DE) .................. 10 2004 024 610

(51) Int. Cl.
*G11C 11/00* (2006.01)
(52) U.S. Cl. .................. 365/148; 365/46; 365/100; 257/154
(58) Field of Classification Search .......... 365/148, 365/153, 163, 51, 100, 151, 154, 158, 171, 365/184, 185.05, 185.22, 185.28, 189.06, 365/202, 209, 222, 225.7, 232; 438/3, 201, 438/210, 238, 240, 258, 582, 586, 597; 257/2, 257/4, 5, 22, 40, 48, 208, 209, 213, 288, 257/295, 296, 313, 315, 316, 324, 347, 351, 257/368, 406, 411, 421, 476, 516, 528, 532, 257/774
See application file for complete search history.

(56) References Cited

U.S. PATENT DOCUMENTS

| 6,418,049 | B1 * | 7/2002 | Kozicki et al. | 365/174 |
| 6,487,106 | B1 * | 11/2002 | Kozicki | 365/153 |
| 2003/0035315 | A1 * | 2/2003 | Kozicki | 365/171 |
| 2003/0053350 | A1 | 3/2003 | Krieger et al. | |

\* cited by examiner

*Primary Examiner*—Richard Elms
*Assistant Examiner*—Harry W Byrne
(74) *Attorney, Agent, or Firm*—Dicke, Billig & Czaja, PLLC

(57) ABSTRACT

A switching element for reversible switching between an electrically insulating OFF state and an electrically conductive ON state, having two electrodes, namely a reactive electrode and an inert electrode, and also a solid electrolyte arranged between the two electrodes, which is characterized by the fact that the electrical conductivity of the solid electrolyte increases as the temperature thereof rises, but essentially no longer increases below a critical decomposition temperature of the solid electrolyte.

28 Claims, 7 Drawing Sheets

SOLID ELECTROLYTE SWITCHING ELEMENT

CROSS-REFERENCE TO RELATED APPLICATIONS

This Utility Patent Application claims priority to German Patent Application No. DE 10 2004 024 610.6 filed on May 18, 2004, which is incorporated herein by reference.

FIELD OF THE INVENTION

The present invention relates, according to its generic type, to a solid electrolyte switching element that can be switched between an electrically insulating OFF state and an electrically conducting ON state. Such a switching element is intended to be used, in particular, in a reconfigurable connection, a reconfigurable electrical conductor network, a reconfigurable integrated circuit or the like, or as a volatile or nonvolatile memory element in a, in particular high-density, memory arrangement.

BACKGROUND

Reconfigurable logic circuits such as field programmable gate arrays (FPGAs) are often used in modern electronic systems. These typically use flash memory cells to store the configuration information. A flash memory is a type of FET memory which typically has a lattice structure composed of columns and rows, a memory cell being arranged at each crossover point between the columns and rows. The memory cells have a control gate and a floating gate, separated from one another by a thin tunnel oxide layer. If an electric field is applied between source and drain, and also to the control gate, electrons can tunnel between the active region of the semiconductor substrate and the floating gate, whereby the threshold voltage of the memory cell can be switched between two states.

Although flash memory technology has undergone rapid further development in recent years, the disadvantages of long write/erase times, which typically lie in the milliseconds range, and high write/erase voltages, which typically lie in the range of 10 to 18 V, and accordingly require a large programming energy, which is in turn an obstacle to the desire for further miniaturization, have not been able to be solved heretofore. Furthermore, the fabrication method for flash memory cells is relatively complicated and thus comparatively expensive.

One approach for fabricating nonvolatile memory cells is based on the use of solid electrolytes as an active (switching) material for nonvolatile memory cells. In this case, chalcogenides, in particular, have been investigated with regard to their suitability as an active material. In this respect, see for example M. N. Kozicki, M. Yun, L. Hilt, A. Singh, Electrochemical Society Proceedings, Vol. 99-13, 298, 1999; M. N. Kozicki, M. Yun, S. J. Yang, J. P. Aberouette, J. P. Bird, Superlattices and Microstructures, Volume 27, No. 5/6, 485-488, 2000; M. N. Kozicki, et al., "Nanoscale phase separation in Ag—Ge—Se glasses", Microelectron. Eng. 63, 155/2002; M. N. Kozicki, M. Mitkova, J. Zhu, M. Park, C. Gopalan, "Can Solid State Electrochemistry Eliminate the Memory Scaling Quandry", Proceedings VLSI, 2002; R. Neale, "Micron to look again at non-volatile amorphous memory", Electronic Engineering Design, 2002.

In this case, it has been illustrated, in particular, that chalcogenides, i.e., alloys containing chalcogens (elements of main group VI of the periodic table), in a solid electrolyte memory cell as has been described by Kozicki et al., for example, have good switching properties.

Solid electrolyte memory cells are based on an electrochemical redox process in which metal ions of one electrode can diffuse reversibly into and out of the solid electrolyte material and thus form and respectively resolve a low-impedance path. More precisely, a solid electrolyte is embedded between two electrodes, one electrode being formed as an inert electrode and the other electrode being formed as a reactive electrode, the reactive electrode forming together with the solid electrolyte a redox system in which a redox reaction proceeds above a defined threshold voltage ($V_{th}$). Depending on the polarity of the voltage applied to the two electrodes, which, however, must be greater than the threshold voltage, the redox reaction can proceed in one reaction direction or the other, metal ions being produced or annihilated. If, in concrete terms, an anodic potential above the threshold voltage is applied to the reactive electrode, then metal ions are produced and emitted into the solid electrolyte. Said metal ions are subsequently reduced in the solid electrolyte and form metallic precipitates. If this process is continued and if metal ions are continuously emitted into the solid electrolyte, then the metallic precipitates increase in number and/or size until a low-impedance current path bridging the two electrodes finally forms. In this state, the electrical resistance of the solid electrolyte is reduced significantly, for example by several orders or magnitude, compared with the state without a low-impedance current path, whereby the ON state of the memory cell is defined. If a voltage of opposite polarity is applied to the two electrodes, then this leads to the interruption of the low-impedance current path, which has the effect that the latter no longer electrically connects the two electrodes to one another throughout, whereby the OFF state of the memory cell is defined.

In the case of solid electrolyte memory cells, but in particular if chalcogenides are used as the solid electrolyte, the problem may arise, however, that the latter already have a sufficiently good ionic conductivity at room temperature, so that the electrochemical redox mechanism may proceed, even without external action, on account of a latent diffusion of metal ions or metal atoms that is present even at room temperature. This phenomenon leads to serious reliability problems, however, since there is the risk of a low-impedance ON state gradually undergoing transition to a high-impedance OFF state, or vice versa, without external action. Furthermore, in this case, in particular, the disadvantageous effect may occur that an unintentional rewriting of adjacent memory cells takes place on account of unavoidable capacitive couplings of adjacent memory cells. This problem occurs primarily in high-density integrated circuits. This problem area is particularly serious at comparatively high write/erase currents, but the latter may be desirable with regard to fast switching operations.

These problems have not yet been able to be solved heretofore. Thus, it has already been attempted to produce a stabler memory state by reducing the ionic mobility of the solid electrolyte at room temperature. However, the programming of such a memory cell then generally requires a brief heating of the solid electrolyte in order thereby to increase the ionic mobility, which can be achieved by applying a short external voltage pulse in order to generate Joule heat. For this purpose, use is made in practice of a solid electrolyte having a negative resistance/temperature characteristic (negative temperature coefficient), that is to say a material which generally has a sigmoidal (S-shaped) current/voltage characteristic, that is to say a current/voltage characteristic that switches between a high and a low electrical resistance.

Although a current/voltage characteristic that is sigmoidal (S-shaped) in the first quadrant has been demonstrated on various switching materials heretofore, this characteristic is generally run through reversibly, i.e., it has not been possible to demonstrate a non-volatile switching effect on these samples heretofore. In this respect, see in particular N. Fuschillo et al., "High-field transport in NiO and $Ni_{1-x}Li_xO$ thin films", Sol. State Electron. 19 (1976) 209-216; K. C. Park, S. Basavaiah, "Bistable switching in Zr—$ZrO_2$—Au junctions", J. Non Cryst. Sol. 2 (1970) 284-291; J. F. Gibbons, W. E. Beadle, "Switching properties of thin NiO films", Sol. State Electron. 7, (1964), 785-797.

Moreover, in the case of a switching element which has such an I-U characteristic that is nonvolatile, on account of the semiconducting conductivity/temperature characteristic (negative temperature coefficient) of the switching solid electrolyte (e.g., Ni—O, Zr—O compounds), the switching operation is destructive after just a few switching cycles, i.e., the solid electrolyte to be switched incurs irreversible degradation effects as a result of an avalanchelike local Joule overheating.

The US Patent Application U.S. 2003/0053350 A1 describes a solid electrolyte switching element. However, no indications about the temperature behavior of the solid electrolyte used can be gathered from this document.

SUMMARY

The present invention provides a switching element. In one embodiment, the present invention provides a switching element configured for switching between an OFF state and an ON state comprising a first electrode, a second electrode, a solid electrolyte arranged between the first electrode and the second electrode, the solid electrode having a critical decomposition temperature, wherein electrical conductivity of the solid electrolyte increases as the temperature rises, but no longer increases when the solid electrolyte reaches a critical temperature below the critical decomposition temperature.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1A:
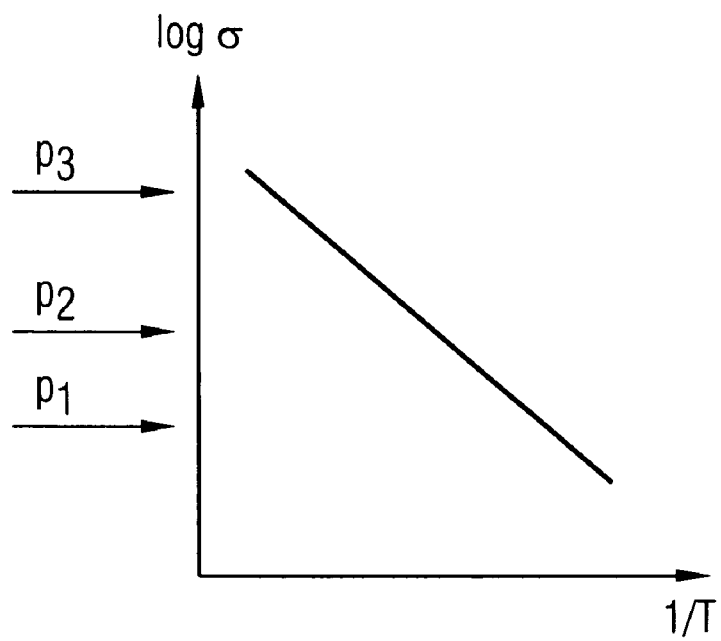
FIG. 1A illustrates the behavior of the electrical conductivity in relation to a change in temperature in an NTC solid electrolyte of a conventional switching element.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a switching element for reversible switching between an electrically insulating OFF state and an electrically conductive ON state, by means of which switching element the disadvantages mentioned in the introduction can be avoided. Thus, such a switching element is small in its dimensions, simple to fabricate and reliable in use and, moreover, not to necessitate high write/erase voltages or a large programming energy. Furthermore, such a switching element is rapidly switchable, for example in the region of the switching times of conventional DRAM/SRAM memory cells, and to avoid an unintentional programming of the memory cell at room temperature on account of diffusive processes or capacitive couplings.

In one embodiment of the invention, a switching element for reversible switching between an electrically insulating OFF state and an electrically conductive ON state comprises two electrodes, namely a reactive electrode and an inert electrode, and also a solid electrolyte arranged between the two electrodes. The solid electrolyte is suitable for electrically insulating the two electrodes from one another, whereby the OFF state is defined. In this case, the reactive electrode and the solid electrolyte together form a redox system in which a redox reaction proceeds above a defined threshold voltage ($V_{th}$), which redox reaction leads to the formation of a low-impedance current path that electrically connects the two electrodes, whereby the ON state of the switching element is defined. A switching element according to the invention is essentially distinguished by the fact that the solid electrolyte has an electrical conductivity that increases as the temperature rises, but essentially no longer increases below a critical decomposition temperature ($T_{crit}$) of the solid electrolyte.

In the sense of the present invention, a "critical decomposition temperature" ($T_{crit}$) is to be understood as a temperature above which a decomposition or destruction of the solid electrolyte occurs, which may be effected, for example, as a result of melting of the solid electrolyte or a change in the composition thereof. To put it in general terms, the solid electrolyte is changed above the critical decomposition temperature such that it can essentially no longer be used for its intended use. Furthermore, it should be clear that according to the invention and in accordance with general understanding in the technical field, an "electrically conducting state" enables an electron current which must be regarded as different from the "ionically conducting state" of the solid electrolyte without a low-impedance current path. For this reason, the solid electrolyte, even though it is ionically conducting, can electrically insulate the two electrodes from one another in order to define the OFF state of the switching element.

If an anodic potential that is higher than the redox potential is applied to the reactive electrode, then the metal of the reactive electrode is oxidized and the metal ions produced are emitted into the solid electrolyte. Said redox potential thus defines the threshold voltage for starting the redox reaction. A reactive electrode in the sense of the invention is thus able to produce (or annihilate) metal ions if a voltage of suitable polarity that is higher than the threshold voltage is applied to the two electrodes. In contrast to this, an "inert electrode" is defined as an electrode that is not able to produce metal ions if the threshold voltage designated above is applied to the two electrodes, i.e., the material of the inert electrode is chosen such that its redox potential in conjunction with the solid electrolyte is in any event higher than that of the material of the reactive electrode. The material of the inert electrode is furthermore chosen such that it does not react chemically with the solid electrolyte.

Advantageously, the solid electrolyte of the switching element according to the invention is a material which has an ionic conductivity that is too low for forming a low-impedance current path at room temperature, but whose ionic conductivity increases as the temperature rises and, still below the critical decomposition temperature ($T_{crit}$) of the solid electrolyte, is high enough to form the low-impedance current path. In a particularly advantageous manner, in the switching element according to the invention, the solid electrolyte can be heated for example by Joule heating in order to increase the ionic conductivity without thereby initiating an avalanchelike heating effect, which would lead to an irreversible destruction of the solid electrolyte. The resulting possibility of using solid electrolytes having at room temperature an ionic conductivity that is so low that an ion diffusion is essentially not made possible prevents an unintentional switching of the switching element at room temperature on account of diffusive processes or capacitive couplings which occur in particular in the case of high operating voltages and a dense packing of the switching elements. In particular, it is possible in the switching element according to the invention to employ comparatively high write/erase voltages in order to obtain fast switching speeds.

The solid electrolyte of the switching element of the invention is preferably a material whose electrical conductivity σ has a sufficiently rising profile as the temperature of the solid electrolyte rises. The solid electrolyte of the switching element according to the invention may in particular have an electrical behavior according to which the temperature coefficient runs through a negative-positive transition as the temperature rises, i.e., a negative temperature coefficient (NTC) changes into a positive temperature coefficient (PTC) as the temperature rises. In this case, such an NTC-PTC transition may advantageously be realized by the formation of the low-impedance current path when the switching element is switched into the ON state. It is equally possible for the NTC-PTC transition to be effected as the temperature of the solid electrolyte rises independently of the formation of the low-impedance current path and to be based on a change in the state of the solid electrolyte itself.

The solid electrolyte of the switching element according to the invention is an ionically conductive material which has a good ionic conductivity for the metal ions of the reactive electrode or can preferably be brought to such a state by heating. Such a solid electrolyte is advantageously a semiconducting material in a specific temperature interval. The solid electrolyte particularly preferably comprises an alloy containing at least one chalcogen, i.e., an element of main group VI of the periodic table, such as O, S, Se, Te. A chalcogenide alloy may be for example Ag—S, Ag—Se, Ni—S, Cr—S, Co—S, Ge—S or Cu—S.

According to one embodiment of the invention, the solid electrolyte of the switching element may also be a porous metal oxide, such as $AlO_x$, $WO_x$, $Al_2O_3$, $VO_x$ or $TiO_x$.

The above enumerations for the solid electrolyte are not intended to restrict the invention thereto. Moreover, it is possible in general to use any solid electrolyte as long as it exhibits the desired electrical behavior.

The material of the reactive electrode may be a metal that is chosen, for example, from Cu, Ag, Au, Ni, Cr, V, Ti or Zn. The inert electrode may comprise a material that is chosen, for example, from W, Ti, Ta, TiN, doped Si and Pt.

The solid electrolyte may in particular be doped with a metal, which is preferably the same metal as that of the reactive electrode. However, it may also be doped with other metallic elements in order to optimize the electrical properties. When such a doping is present, it is advantageously possible to reduce the time period for creating a low-impedance current path for bridging the two electrodes since, to put it clearly, only the remaining "gaps" between adjacent metal precipitates have to be filled with metal. The response time of the switching element can be reduced in this way. Care must nonetheless be taken, however, to ensure that the insulation property of the solid electrolyte is not impaired by the doping.

According to one embodiment of the invention, the inert electrode is considered to be "inert" if its redox potential is greater than the potential used for switching the switching element. In this case, it may be advantageous for the material of the inert electrode to have a redox potential which is not reached at a threshold voltage of a maximum of 2 volts. According to one embodiment of the invention, it is preferred for the threshold voltage to lie below one volt, and it may typically lie in the range of 150 to 500 mVolts. According to one embodiment of the invention it is preferred for the two electrodes to be at a distance from one another which lies in the range of 10 nm to 250 nm. It is more preferred for the distance between the two electrodes to lie in the range of 20 nm to 100 nm, and to be for example 50 nm.

The switching element according to the invention advantageously realizes fast switching speeds that at least reach the present-day switching speeds of conventional DRAM/SRAM switching cells. According to the invention, a switching speed of a maximum of 1 μs is preferred. A switching speed of less than 100 ns is more preferred, and a switching speed of less than 10 ns is even more preferred.

The switching element according to the invention can advantageously be used in a reconfigurable electrical connection. Electrical connections of this type can be combined to form a reconfigurable conductor network. Switching elements according to the invention can furthermore be used in reconfigurable integrated circuits. Furthermore, the switching elements according to the invention can be used in high-density, volatile or nonvolatile semiconductor memory cells or semiconductor memory chips.

Figure 1B:
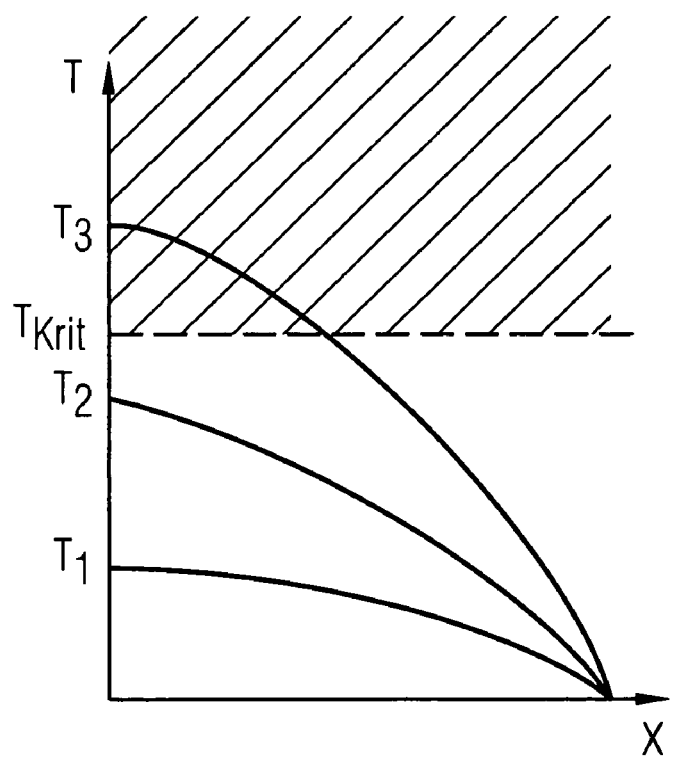
FIG. 1B illustrates the temperature profile of the solid electrolyte from FIG. 1A at three different temperatures.

FIGS. 1A and 1B relate to a conventional switching element with an NTC solid electrolyte. FIG. 1A illustrates the profile of the conductivity σ (sigma) in the case of a change in the temperature T of a semiconducting chalcogenide solid electrolyte in a logarithmic representation. As can be gathered from FIG. 1A, the conductivity a rises essentially exponentially on account of the NTC behavior as the temperature increases. $P_1$, $P_2$ and $P_3$ here symbolize three different power values when heating the sample by means of Joule heating. These different power values may equally be interpreted as dynamic sequential states which are assumed with electrical energy being continuously supplied. FIG. 1B illustrates an associated thermal profile of the measurement sample from FIG. 1A, the temperature T of the solid electrolyte being represented with regard to a distance X from the central plane of the measurement sample. Accordingly, when considered instantaneously, a power value $P_1$ leads to a temperature $T_1$ at the location of the central plane of the sample which falls with increasing distance from the central plane. The same applies correspondingly to the power values $P_2$ and $P_3$, which lead to a temperature $T_2$ and $T_3$, respectively, at the location of the central plane of the sample. FIG. 1B illustrates the case where $T_3$ lies above a critical decomposition temperature ($T_{crit}$) at which a decomposition of the chalcogenide solid electrolyte occurs, for instance as a result of melting or a change in the composition. If the respective temperatures $T_1$, $T_2$ and $T_3$ are interpreted as dynamic sequential states with electrical energy being continuously supplied, then an irreversible decomposition of the chalcogenide matrix is brought about by an avalanche-like Joule heating to a temperature above the critical decomposition temperature.

Figure 2A:
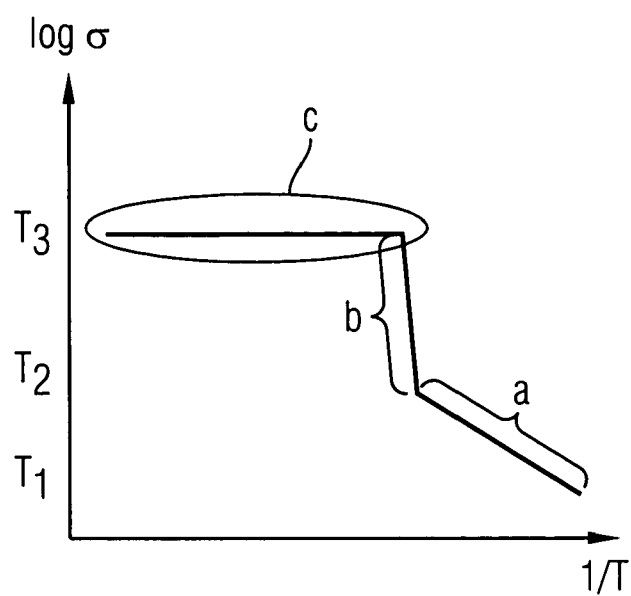
FIG. 2A illustrates by way of example the behavior of the electrical conductivity in the case of a change in temperature in a solid electrolyte of the switching element according to the invention.
Figure 2B:
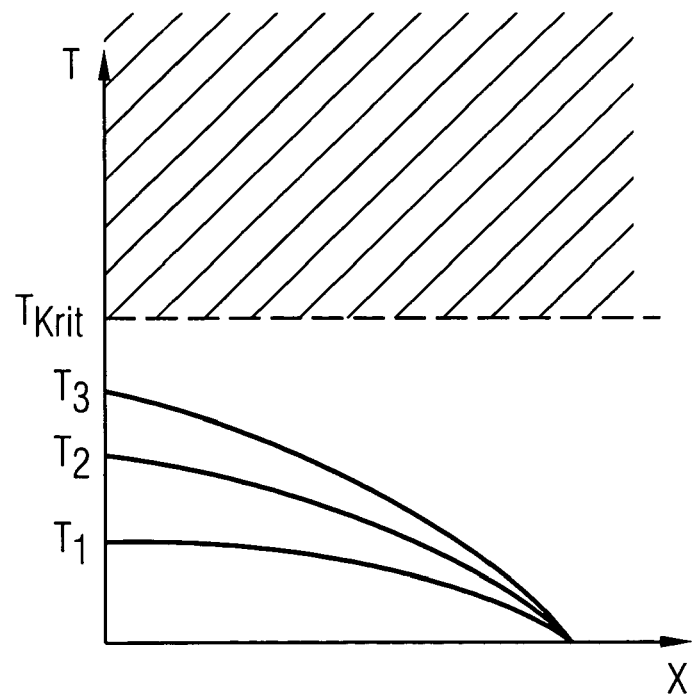
FIG. 2B illustrates by way of example the temperature distribution in the solid electrolyte from FIG. 2A at three different temperatures.

Reference is made to FIGS. 2A and 2B in order to illustrate one embodiment of the present invention. FIG. 2A schematically illustrates an exemplary electrical conductivity as a function of the temperature of the solid electrolyte according to the invention. As can be gathered from FIG. 2A, the electrical conductivity σ of the solid electrolyte initially increases as the temperature rises (region a), i.e., the solid electrolyte exhibits in this region an electrical behavior that can be characterized by a negative temperature coefficient. If the temperature rises still further, then the electrical conductivity σ increases very greatly within a small temperature interval (region b), which may be associated with a semiconductor-metal phase transition. This great increase in the electrical conductivity σ of the solid electrolyte subsequently undergoes transition to a saturation behavior as the temperature increases further (region c). In this case, the temperatures $T_1$, $T_2$ and $T_3$ of the solid electrolyte are assigned to the different regions a, b, c of the electrical conductivity σ of the solid electrolyte. If the solid electrolyte has a temperature $T_1$, then the electrical resistance is characterized by a negative temperature coefficient. At a temperature $T_2$, there begins the transition region to an electrical conductivity that is essentially constant (in a logarithmic representation) in the case of a change in temperature, and this region can be assigned to a temperature $T_3$.

FIG. 2B illustrates by way of example the thermal profile as a function of a distance X from a central plane of the measurement sample of a solid electrolyte from FIG. 2A. As can be gathered from FIG. 2B, the temperature $T_3$ at which an electrical conductivity that is essentially constant in the case of a change in temperature occurs lies below the critical decomposition temperature $T_{crit}$ of the solid electrolyte. If the three temperatures $T_1$, $T_2$ and $T_3$ are interpreted as dynamic sequential processes with the solid electrolyte being continuously heated, an avalanchelike Joule heating to a temperature above the critical decomposition temperature $T_{crit}$ can accordingly be avoided, in an advantageous manner, on account of the saturation behavior (region c) of the electrical conductivity of the solid electrolyte as the temperature increases.

Figure 3A:
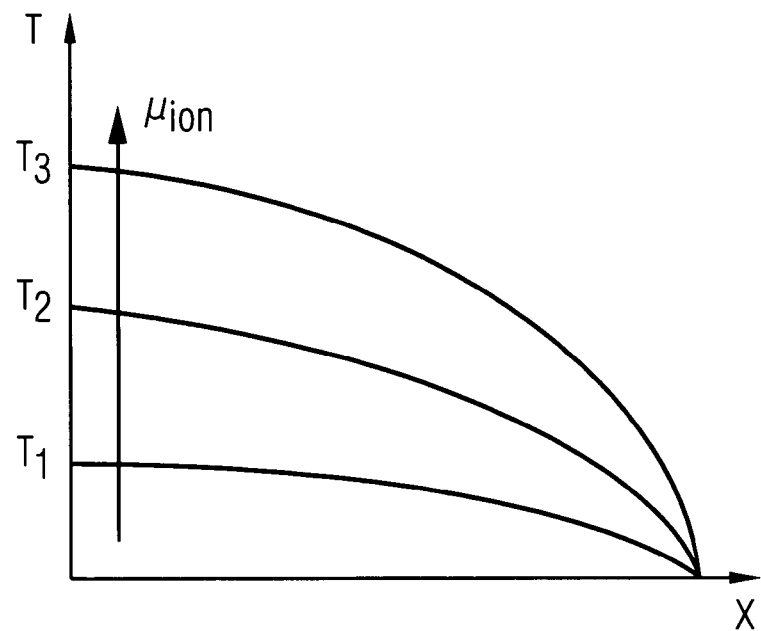
FIG. 3A illustrates the increase in ionic mobility as the temperature rises in the solid electrolyte from FIG. 2A.
Figure 3B:
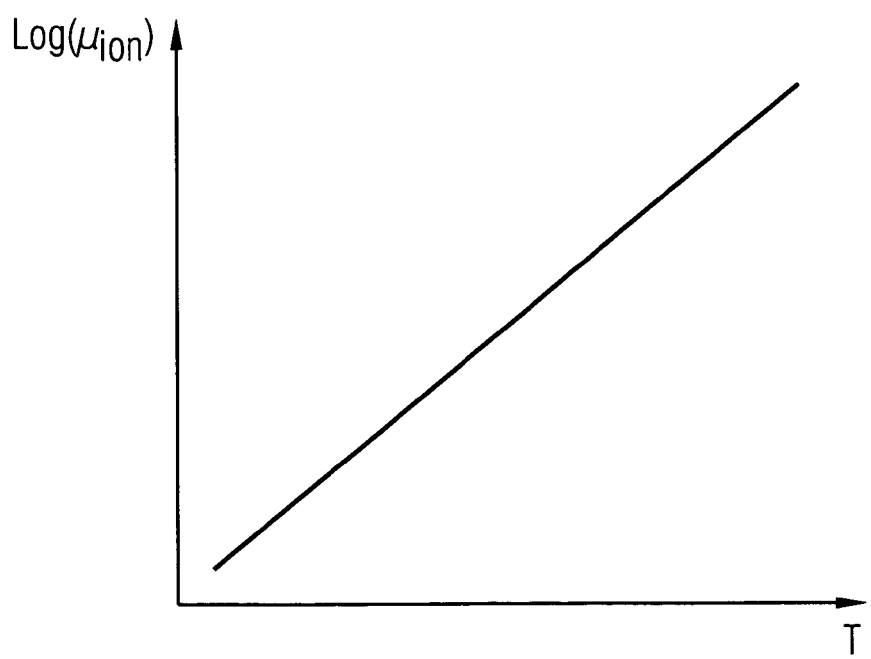
FIG. 3B illustrates by way of example the increase in ionic mobility in the case of a change in temperature in the solid electrolyte from FIG. 2A.

FIGS. 3A and 3B illustrate the increase in the ionic mobility $\mu_{Ion}$ of the solid electrolyte from FIG. 2A as the temperature rises. FIG. 3A illustrates an illustration—corresponding to FIG. 2B—of the temperature profile of the measurement sample with increasing distance X from a central plane thereof. As is symbolized by the arrow in FIG. 3A, the ionic conductivity $\mu_{Ion}$ of the solid electrolyte increases as the temperature of the solid electrolyte increases. FIG. 3B illustrates the behavior of the ionic mobility $\mu_{Ion}$ as a function of the temperature of the solid electrolyte in a logarithmic representation. Accordingly, the ionic conductivity $\mu_{Ion}$ of the solid electrolyte increases essentially exponentially with the temperature thereof.

FIGS. 2A, 2B, 3A and 3B serve merely for exemplary illustration of properties of the solid electrolyte of the switching element according to the invention, which are not intended to restrict the invention in any respect whatsoever.

Figure 4:
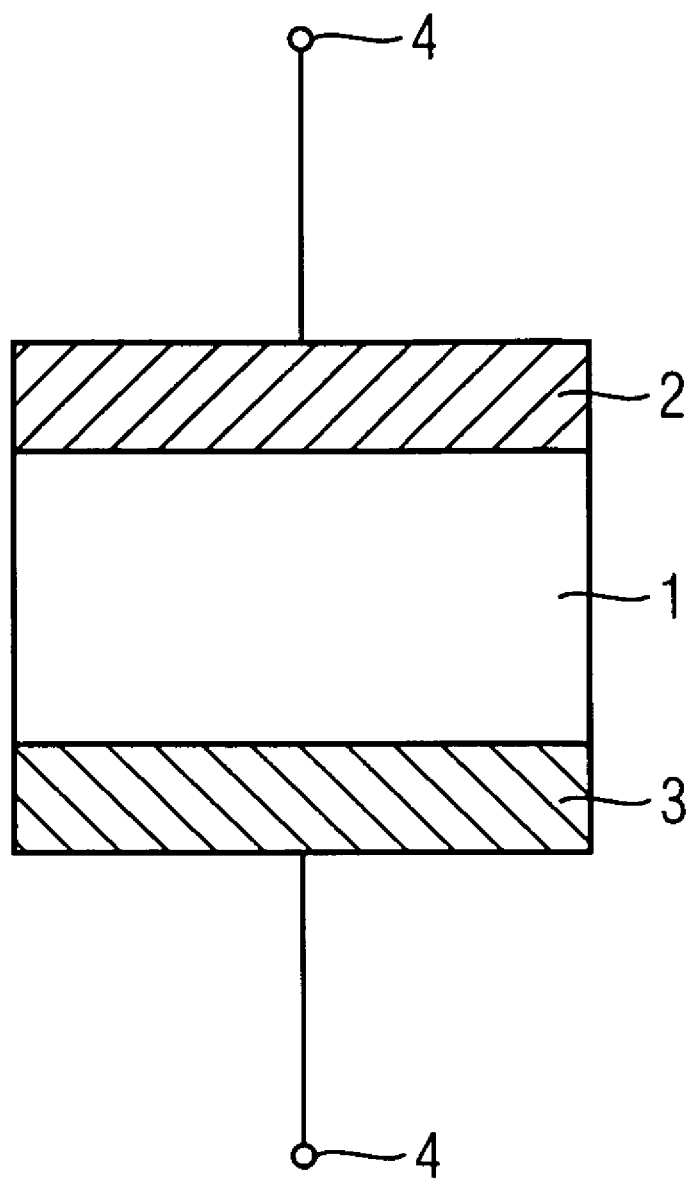
FIG. 4 schematically illustrates an exemplary construction of a switching element according to the invention.

FIG. 4 schematically illustrates an exemplary construction of a switching element according to the invention. As can be gathered from FIG. 4, a solid electrolyte 1, for example a chalcogenide compound with an NTC-PTC transition behavior, is arranged between two electrodes in a sandwich design. The bottom electrode 3 is a reactive electrode, for example an Ag electrode. The top electrode 2 is an inert electrode, for example a W electrode. The solid electrolyte is doped with the same metal of which the reactive metal ion donor electrode 2 is composed, in this case Ag. A voltage for switching the switching element can be applied to the two electrodes 2, 3 at connecting terminals 4. The solid electrolyte is a material having an ionic conductivity that is too low at room temperature for forming a low-impedance current path between the two electrodes. The ionic conductivity of the solid electrolyte can be increased by heating, and, still below a critical decomposition temperature of the solid electrolyte it is high enough to form the low-impedance current path. The solid electrolyte is for example semiconducting Ag—Se with an NTC behavior.

Figure 5A:
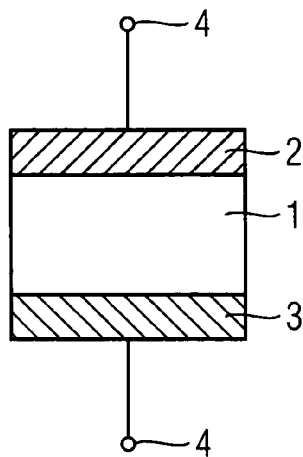
FIGS. 5A-5G schematically illustrate the transition from the OFF state to the ON state when the switching element according to the invention is heated by application of an electrical voltage.
Figure 5B:
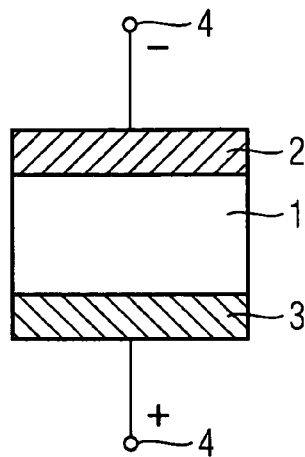
Figure 5C:
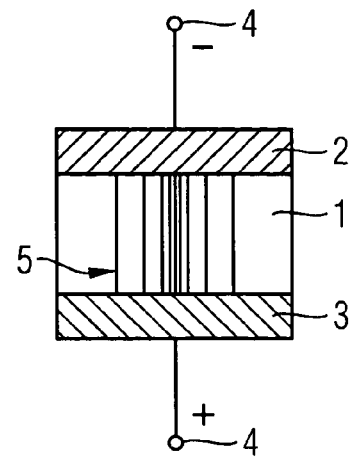
Figure 5D:
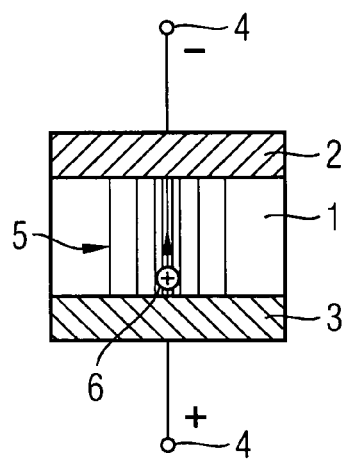
Figure 5E:
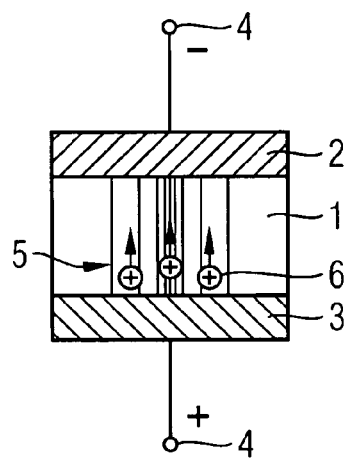
Figure 5F:
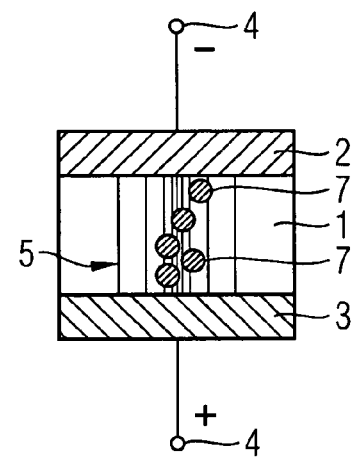
Figure 5G:
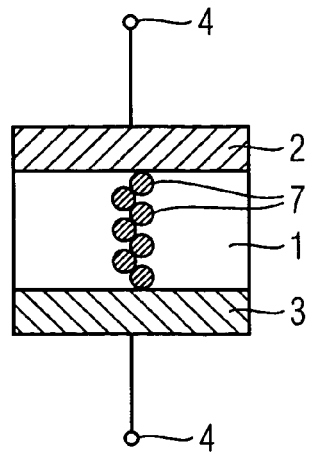

The sequence of FIGS. 5A to 5G describes the transition of the switching element according to the invention from FIG. 4 from the OFF state thereof to the ON state thereof. FIG. 5A illustrates an initial state in which the switching element is in its OFF state, in which the two electrodes 2, 3 are electrically insulated from one another by the solid electrolyte 1. An electrical voltage is then applied to the two electrodes 2, 3 (FIG. 5B), the anodic potential being connected to the reactive metal electrode 3, while the cathodic potential is connected to the inert electrode 2. The voltage applied to the two electrodes 2, 3 is greater than the threshold voltage, which results from the Redox potential of the Redox system comprising reactive metal electrode 3 and solid electrolyte 1 for starting the Redox reaction. The voltage applied for switching the switching element into its ON state is referred to as the "write voltage". The ionic conductivity of the solid electrolyte 1 is too low at room temperature to enable a low-impedance current path to be formed between the two electrodes 2, 3. The application of the write voltage then leads to an avalanchelike heating of the solid electrolyte 1 on account of the generation of Joule heat (FIG. 5C). As is illustrated in FIG. 5C, the solid electrolyte is heated proceeding from a central plane of the switching element, a temperature profile 5 corresponding to FIG. 2B forming with increasing distance from the central plane. Since the conductivity of the solid electrolyte 1 exhibits a saturation behavior as the temperature rises further, this has the effect that the Joule heat generated per unit time is essentially constant (FIG. 5D). In this state, the ionic mobility $\mu_{Ion}$ of the solid electrolyte 1 is increased to an extent such that the metal ions produced by the applied voltage at the reactive metal electrode 3 are emitted into the solid electrolyte 1. The metal ions 6 are reduced in the solid electrolyte 1 and form metallic precipitates (FIG. 5F). With a further introduction of metal ions 6 into the solid electrolyte 1, the metallic precipitates 7 increase in number and/or size and finally form a readily conductive (low-impedance) current path for bridging the two electrodes 2, 3 within the solid electrolyte 1 (FIG. 5G). The low-impedance current path short-circuits the two electrodes 2, 3 and, on account of its comparatively low resistance, prevents a further current flow through the solid electrolyte outside the low-impedance current path. The electrical behavior of the solid electrolyte 1 with the low-impedance current path formed therein is thus like a material having a positive temperature coefficient (PTC). Since the Joule heat generated is significantly lower in this state, the solid electrolyte 1 cools down.

Figure 6A:
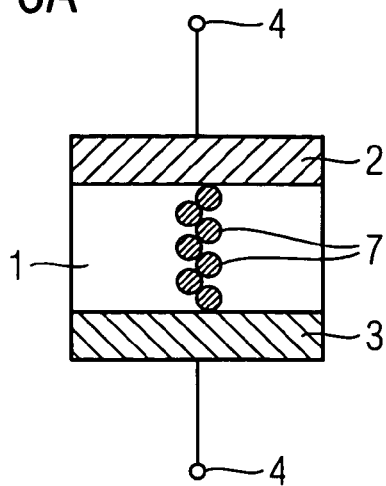
FIGS. 6A-6E schematically illustrate the transition from the ON state to the OFF state in the switching element according to the invention by application of an electrical voltage having an opposite polarity to FIGS. 5A-5G.
Figure 6B:
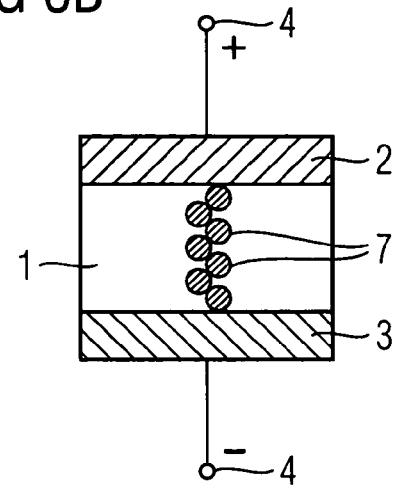
Figure 6C:
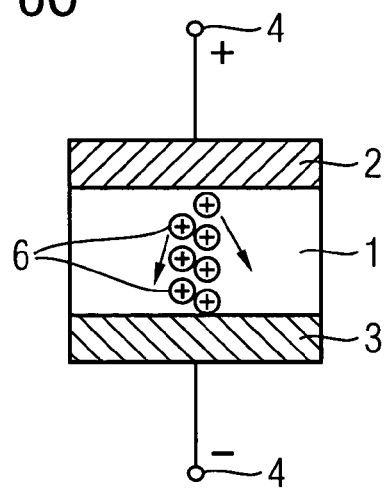
Figure 6D:
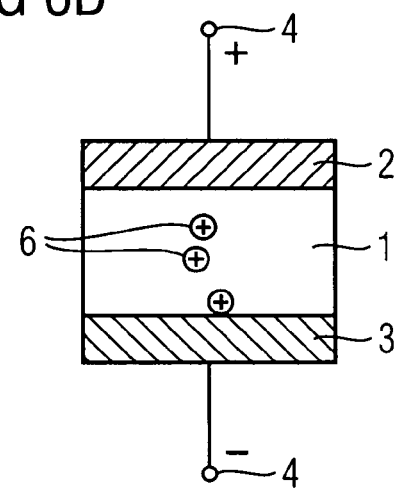
Figure 6E:
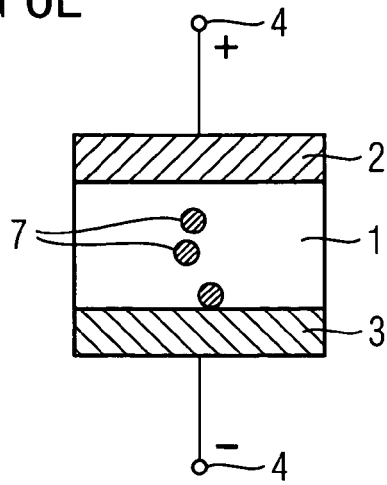

The sequence of FIGS. 6A to 6E schematically illustrates an exemplary transition from the ON state to the OFF state of the switching element according to the invention. Proceeding from the ON state of the switching element according to the invention as illustrated in FIG. 6A, in which a low-impedance current path comprising low-impedance precipitates 7 that bridges the two electrodes 2, 3 is formed in the solid electrolyte 1, an electrical voltage is applied to the two electrodes 2, 3, the cathodic potential in this case being connected to the reactive metal electrode 3, while the anodic potential is connected to the inert electrode 2. FIG. 6B illustrates a state in which the magnitude of the voltage applied to the two electrodes 2, 3 lies below an erase voltage ($V_{er}$). The magnitude of the erase voltage depends on specific particular features of the switching element, in particular the Redox system used, and is defined by the condition that the elemental metal of the low-impedance precipitates 7 is to be oxidized in the solid electrolyte 1. FIG. 6C illustrates a state in which the voltage applied to the two electrodes 2, 3 at least reaches the value of the erase voltage $V_{er}$. The metal of the metallic precipitates 7 is thereby oxidized, as a result of which the metal ions 6 are formed. The metal ions 6 formed in the solid electrolyte 1 migrate to the cathode, more precisely to the reactive metal electrode 3 connected to the cathodic potential. For this purpose, it is not absolutely necessary for the solid electrolyte 1 to have a high ionic conductivity, so that it is not necessary to heat the solid electrolyte 1 in order to increase the ionic conductivity during the transition of the switching element from its ON state to its OFF state. FIG. 6D illustrates a state directly before the applied voltage is switched off, in which state the low-impedance current path between the two electrodes 2, 3 has already been interrupted. Finally, FIG. 6E illustrates a state in which isolated metallic precipitates 7 have remained in the solid electrolyte 1, but they do not form a continuous low-impedance current path between the two electrodes 2, 3. Metal ions that have remained in the solid electrolyte 1 are reduced again after the applied voltage is switched off.

Figure 7:
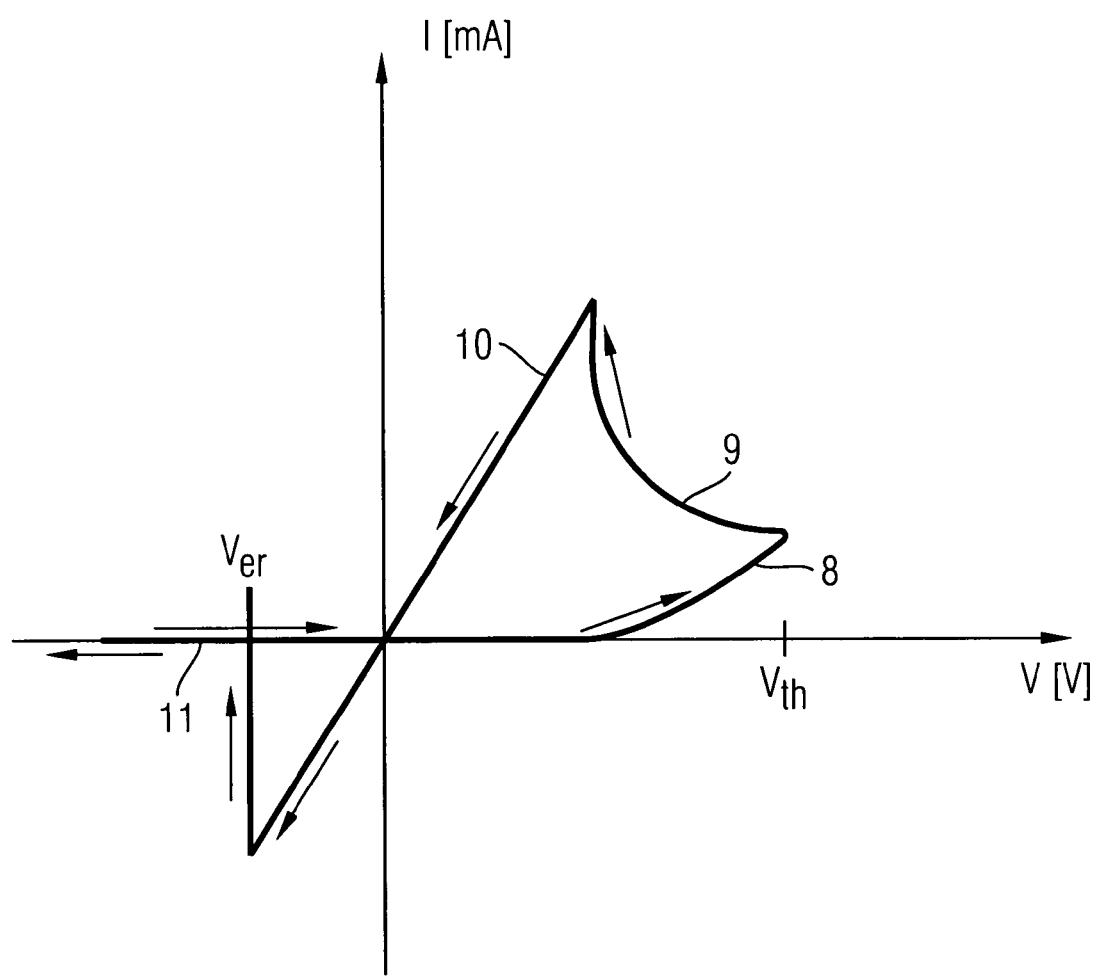
FIG. 7 schematically illustrates an exemplary current/voltage behavior of the solid electrolyte with an NTC-PTC transition in the switching element according to the invention.

FIG. 7 schematically illustrates an exemplary current/voltage behavior of a semiconducting solid electrolyte of the switching element according to the invention. As can be gathered from FIG. 7, proceeding from the origin the current rises as the voltage increases until the threshold voltage $V_{th}$ for starting the Redox reaction is reached. In this region 8, the temperature of the solid electrolyte rises greatly on account of its NTC behavior as a result of Joule heating and increases the ionic mobility of the solid electrolyte in this case. When the threshold voltage $V_{th}$ is reached, the ionic mobility of the solid electrolyte is high enough such that a low-impedance current path can form between the two electrodes. Line 9 indicates the formation of the low-impedance current path between the two electrodes, i.e., the transition from the OFF state to the ON state of the switching element according to the invention. If the low-impedance current path is formed between the two electrodes, then the electrical conductivity of the solid electrolyte changes from semiconducting to metallic, which is accompanied by a change in the NTC behavior to a region 10 with PTC behavior. If the polarity of the voltage applied to the two electrodes is then changed, metallic PTC behavior is present for as long as the erase voltage $V_{er}$ is not reached. When the erase voltage $V_{er}$ is reached, the low-impedance current path between the two electrodes is resolved, and the electrical conductivity of the solid electrolyte changes from a region 10 with metallic conductivity and PTC behavior to a region 11 with semiconducting conductivity and NTC behavior. The switching element is then in its OFF state. The switching cycle of the switching element according to the invention can be run through reversibly in this way.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A switching element configured for switching between an OFF state and an ON state comprising:
    a first electrode;
    a second electrode;
    a semiconductor material comprising a metal oxide contacting the first electrode and the second electrode, the semiconductor material having a critical decomposition temperature, wherein electrical conductivity of the semiconductor material increases as the temperature rises, but no longer increases when the semiconductor material reaches a critical temperature below the critical decomposition temperature.

2. The switching element of claim 1, wherein when the semiconductor material is at a first temperature, the semiconductor material electrically insulates the first electrode from the second electrode to define the OFF state.

3. The switching element of claim 1, wherein the semiconductor material and the second electrode form a redox system.

4. The switching element of claim 1, wherein the semiconductor material acts as an insulator at room temperature.

5. A switching element for reversible switching between an electrically insulating OFF state and an electrically conductive ON state, comprising:
    a reactive electrode and an inert electrode;
    a semiconductor material comprising a metal oxide having a critical deposition temperature, the semiconductor material contacting the reactive electrode and the inert electrode, the semiconductor material configured for electrically insulating the two electrodes from one another to define the OFF state, wherein in an ON state, the semiconductor material's electrical conductivity increases as the temperature rises, but no longer increases at a critical temperature below the critical decomposition temperature of the semiconductor material.

6. The switching element of claim 1, further comprising:
a redox system formed by the reactive electrode and the semiconductor material together, in which a redox reaction proceeds above a defined threshold voltage, which redox reaction proceeds in one direction or the other depending on the polarity of a voltage applied to the electrodes, where upon application of the positive pole of a voltage above the threshold voltage to the reactive electrode, metal ions are produced which are reduced in the semiconductor material and increase a metal concentration in the semiconductor material, a metal concentration in the semiconductor material above a limit concentration leading to the formation of a low-impedance current path bridging the two electrodes, whereby the ON state is defined.

7. The switching element of claim 5, wherein the semiconductor material has an ionic conductivity that does not suffice at room temperature for forming a low-impedance current path and an ionic conductivity that increases as the temperature rises and, below the critical decomposition temperature of the semiconductor material, is high enough to form the low-impedance current path.

8. The switching element of claim 5, comprising the semiconductor material whose electrical conductivity has an essentially sigmoidal profile as a function of the temperature of the semiconductor material.

9. The switching element of claim 5, wherein the semiconductor material has a temperature coefficient that exhibits a negative-positive transition as the temperature rises.

10. The switching element of claim 9, wherein the negative-positive transition of the temperature coefficient of the semiconductor material is effected by the formation of the low-impedance current path.

11. The switching element of claim 5, wherein the semiconductor material comprises at least one material that is semiconducting in a specific temperature range.

12. The switching element of claim 5, wherein the inert electrode contains at least one material from the group consisting of W, Ti, Ta, TiN, doped Si and Pt.

13. The switching element of claim 5, wherein the semiconductor material is doped with at least one metal.

14. The switching element of claim 13, wherein the metal used for doping the semiconductor material is identical to the metal of the reactive electrode.

15. A switching element for reversible switching between an electrically insulating OFF state and an electrically conductive ON state comprising:
a reactive electrode and an inert electrode; and
a semiconductor material comprising a metal oxide contacting the two electrodes, the semiconductor material being suitable for electrically insulating the two electrodes from one another, whereby the OFF state is defined, the reactive electrode and the semiconductor material together forming a redox system in which a redox reaction proceeds above a defined threshold voltage ($V_{th}$), which redox reaction proceeds in one direction or the other depending on the polarity of a voltage (V) applied to the electrodes, in which case, upon application of the positive pole of a voltage above the threshold voltage to the reactive electrode, metal ions are produced which are reduced in the semiconductor material and increase a metal concentration in the semiconductor material, a metal concentration in the semiconductor material above a limit concentration leading to the formation of a low-impedance current path bridging the two electrodes, whereby the ON state is defined, featuring a semiconductor material whose electrical conductivity increases as the temperature rises, but essentially no longer increases below a critical decomposition temperature ($T_{crit}$) of the semiconductor material.

16. The switching element of claim 15 wherein the threshold voltage ($V_{th}$) is a maximum of 2 V.

17. The switching element of claim 15 wherein the threshold voltage ($V_{th}$) is a maximum of 1 V, more preferably lies in the range between 150 and 500 mV, and is for example 250 mV.

18. The switching element of claim 15 wherein the two electrodes are at a distance from one another which lies in the range of 10 nm to 250 nm, more preferably lies in the range of 20 nm to 100 nm, and is for example 50 nm.

19. The switching element of claim 15, comprising featuring a switching speed of a maximum of 1 μs, preferably a maximum of 100 ns, and particularly preferably a maximum of 10 ns.

20. The switching element of claim 15, comprising featuring a heating of the semiconductor material by means of Joule heating.

21. The switching element of claim 1, wherein the switching element is configured as a reconfigurable electrical connection.

22. The switching element of claim 1, wherein the switching element is part of a reconfigurable conductor network.

23. The switching element of claim 1, wherein the switching element is part of a reconfigurable integrated circuit.

24. A memory cell arrangement comprising:
at least one switching element comprising:
a switching element configured for switching between an OFF state and an ON state comprising:
  a first electrode;
  a second electrode;
  a semiconductor material comprising a metal oxide contacting the first electrode and the second electrode, the semiconductor material having a critical decomposition temperature, wherein electrical conductivity of the semiconductor material increases as the temperature rises, but no longer increases when the semiconductor material reaches a critical temperature below the critical decomposition temperature.

25. The switching element of claim 1, wherein the metal oxide comprises one of $VO_x$, $TiO_x$, $CrO_x$, and $CoO_x$.

26. The switching element of claim 5, wherein the metal oxide comprises one of $VO_x$, $TiO_x$, $CrO_x$, and $CoO_x$.

27. The switching element of claim 15, wherein the metal oxide comprises one of $VO_x$, $TiO_x$, $CrO_x$, and $CoO_x$.

28. The memory cell arrangement of claim 24, wherein the metal oxide comprises one of $VO_x$, $TiO_x$, $CrO_x$, and $CoO_x$.

* * * * *